United States Patent
Templeton et al.

(10) Patent No.: US 6,663,723 B1
(45) Date of Patent: Dec. 16, 2003

(54) VAPOR DRYING FOR CLEANING PHOTORESISTS

(75) Inventors: Michael K. Templeton, Atherton, CA (US); Ramkumar Subramanian, San Jose, CA (US); Khoi A. Phan, San Jose, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 48 days.

(21) Appl. No.: 09/974,276

(22) Filed: Oct. 10, 2001

Related U.S. Application Data

(60) Provisional application No. 60/242,761, filed on Oct. 24, 2000.

(51) Int. Cl.[7] .................................................. B08B 5/00
(52) U.S. Cl. ......................................... 134/31; 34/449
(58) Field of Search ....................... 134/31, 902; 34/77, 34/78, 443, 468, 448, 449

(56) References Cited

U.S. PATENT DOCUMENTS

| | | | |
|---|---|---|---|
| 4,841,645 A | 6/1989 | Bettcher et al. ................ 34/78 |
| 4,992,108 A * | 2/1991 | Ward et al. .................... 134/38 |
| 5,054,210 A | 10/1991 | Schumacher et al. .......... 34/78 |
| 5,371,950 A | 12/1994 | Schumacher .................... 34/78 |
| 5,539,995 A | 7/1996 | Bran .............................. 34/77 |
| 5,868,906 A | 2/1999 | Adams et al. ................. 203/18 |
| 6,026,588 A | 2/2000 | Clark et al. .................... 34/77 |
| 6,261,845 B1 * | 7/2001 | Verhaverbeke et al. ....... 436/55 |

OTHER PUBLICATIONS

Peters, Laura "Water Spots: The Scourge of Wafer Dryers," Semiconductor International, Aug. 1998, http://www.semiconductor.net/seminconductor/issues/Issues/1998/aug98/docs/feature3.asp.

\* cited by examiner

*Primary Examiner*—Alexander Markoff
(74) *Attorney, Agent, or Firm*—Amin & Turocy, LLP

(57) ABSTRACT

One aspect of the present invention relates to a method of cleaning a patterned photoresist clad structure involving the steps of contacting the patterned photoresist clad structure with an alcohol vapor comprising at least one compound having the Formula ROH, wherein R is a hydrocarbon group comprising from 4 to about 8 carbon atoms; condensing the alcohol vapor on the patterned photoresist clad structure; and removing the condensed alcohol vapor from the patterned photoresist clad structure. Another aspect of the present invention involves the use of an alcohol vapor having a boiling point from about 102° C. to about 175° C. Yet another aspect of the present invention involves the use of an alcohol vapor having a flash point from about 15° C. to about 80° C.

19 Claims, 1 Drawing Sheet

VAPOR DRYING FOR CLEANING PHOTORESISTS

RELATED APPLICATIONS

This application claims domestic priority to provisional application Ser. No. 60/242,761 filed Oct. 24, 2000.

TECHNICAL FIELD

The present invention generally relates to processing a photoresist clad semiconductor substrate. In particular, the present invention relates to cleaning a semiconductor substrate having a patterned photoresist thereon using vapor drying techniques.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of conductive features and the surface geometry such as corners and edges of various features.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Patterning a photoresist over a semiconductor substrate is typically followed by a deionized water rinse, which is then followed by a spin-drying step. However, there are three notable problems associated with water rinse and spin-drying patterned photoresist clad structures.

One problem is the formation of watermarks on the surface of the patterned photoresist clad structures. Watermarks typically form when dissolved, non-volatile material (such as silica and other dissolved contaminants) precipitate out of the deionized water as it evaporates from the surface of the structure. The presence of watermarks on a semiconductor structure may create difficulties in subsequent manufacturing processes. Watermarks, which can be as small as 1 to 10 $\mu$m and laden with particulate matter, are difficult to prevent and/or remove. As feature sizes continue to shrink, surface tension between the liquid and the device features on the semiconductor structure increases, so watermarks are created more easily.

Another problem with spin dryers is the possible charging of patterned photoresist clad structures which causes them to attract particles upon exposure to a cleanroom. Spin rinse dryers provide an ideal environment for static charge generation and build-up. In a spinning chamber, highly insulative deionized water shears across photoresist and silicon and surfaces (and other insulative materials), creating high levels of static charge. Although static charges are generated inside most semiconductor process tools, higher levels typically occur in spin rinse dryers. Charged structures leaving the spin rinse dryers immediately attract and bond particles and other airborne contaminants on their surfaces.

Yet another problem with spin dryers is the damage caused by the large shear forces. In particular, the features of the patterned photoresist (such as lines and mesas) may break or become damaged under the shear forces from spinning. And as feature sizes decrease, the mechanical stability of the features decreases. This is especially true for high pitch features and fine line lithography. The continuing trend toward higher device densities leads to more damage caused by the large shear forces.

Attempts to solve the three aforementioned problems associated with spin drying involve the use of isopropyl alcohol. In one such technique, the water on the surface of the wafer is displaced by isopropyl alcohol before the water has a chance to evaporate, and then the alcohol is evaporated from the surface of the wafer. Another technique, called vapor drying, involves condensation of isopropyl alcohol vapor onto the surface of the wafer, causing the water present on the wafer to be taken up by the dry alcohol. The water-rich alcohol then drips off of the wafer before water evaporation can occur, and is replaced by more dry alcohol condensate, which is then evaporated.

Isopropyl alcohol vapor drying is frequently employed to clean inorganic surfaces on semiconductor structures. Inorganic surfaces include those made of silicon dioxide, silicon nitride, polysilicon, amorphous silicon, metals, metal nitrides, metal suicides, and the like. However, the use of isopropyl alcohol vapor drying on patterned photoresist clad semiconductor structures often results in damage to the photoresist pattern. This is believed attributable to undesirable interaction between isopropyl alcohol and the organic photoresist material. Accordingly, there is an unmet need for methods and systems that improve lithography, and in particular, improve the cleaning of patterned photoresist clad semiconductor structures without degrading the photoresist pattern.

SUMMARY OF THE INVENTION

The present invention provides systems and methods for cleaning patterned photoresists using an alcohol vapor. The alcohol vapor cleans and dries the patterned photoresist while minimizing or eliminating the removal or destruction of the pattern, as well as minimizing the formation of watermarks on the photoresist. The shear forces associated with spin drying, that may remove, damage or break the pattern are also eliminated by the present invention.

One aspect of the present invention relates to a method of cleaning a patterned photoresist clad structure involving the steps of contacting the patterned photoresist clad structure with an alcohol vapor comprising at least one compound having the Formula ROH, wherein R is a hydrocarbon group comprising from 4 to about 8 carbon atoms; condensing the alcohol vapor on the patterned photoresist clad structure; and removing the condensed alcohol vapor from the patterned photoresist clad structure.

Another aspect of the present invention relates to a method of cleaning a patterned photoresist clad structure involving the steps of contacting the patterned photoresist clad structure with a vapor comprising an organic compound having a boiling point from about 102° C. to about 175° C.; condensing the vapor on the patterned photoresist clad structure; and removing the condensed vapor from the patterned photoresist clad structure.

Yet another aspect of the present invention relates to a method of cleaning a patterned photoresist clad structure involving the steps of contacting the patterned photoresist clad structure with a vapor comprising an organic compound having a flash point from about 15° C. to about 80° C.; condensing the vapor on the patterned photoresist clad structure; and removing the condensed vapor from the patterned photoresist clad structure.

DISCLOSURE OF INVENTION

Figure 1:
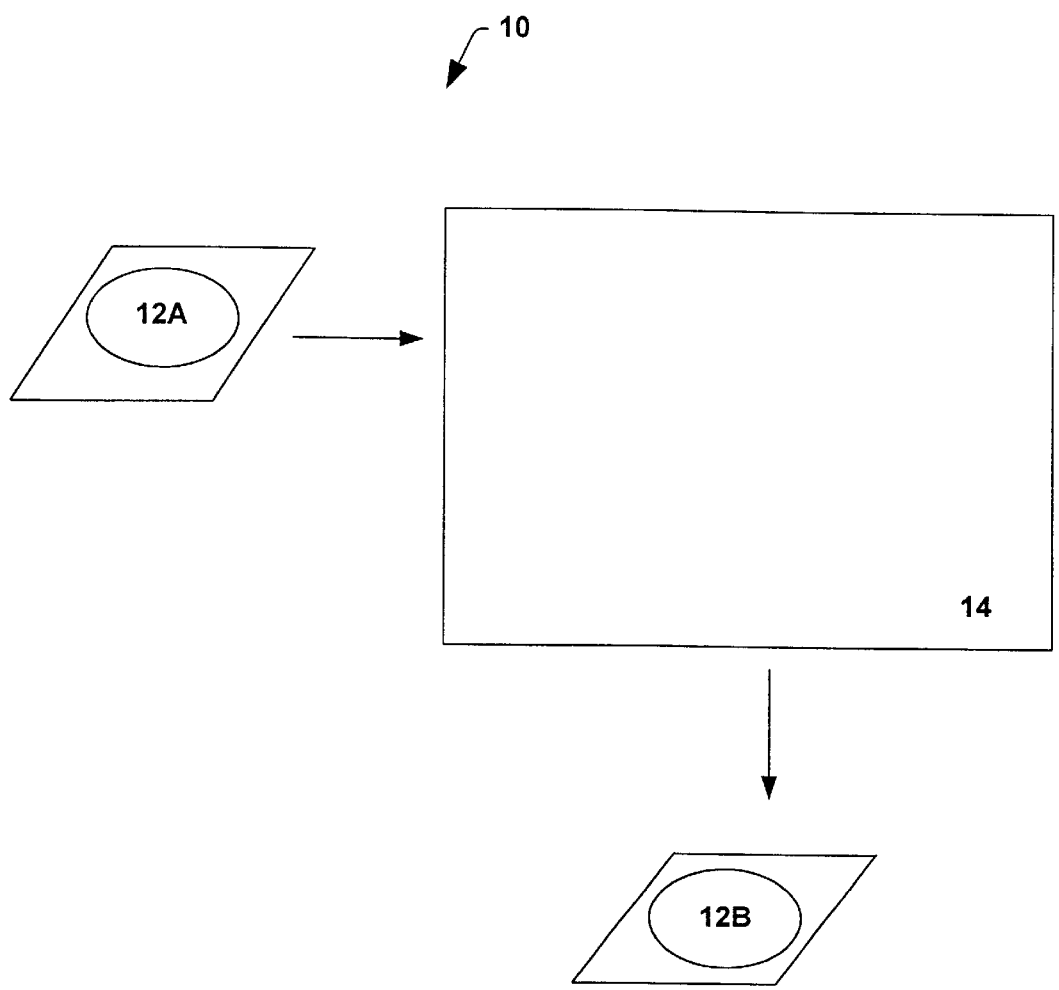
FIG. 1 illustrates one aspect of a system/method of cleaning a patterned photoresist clad structure according to the present invention.

The present invention involves using an alcohol vapor to clean and dry a patterned photoresist clad semiconductor substrate. This typically occurs after the photoresist is deposited on the semiconductor substrate, selectively irradiated, and developed to form a pattern or mask to facilitate further processing of the semiconductor substrate.

The photoresist that is subjected to the cleaning treatment is any photoresist employed in the semiconductor field. Photoresists typically contain an organic polymeric material. Positive or negative photoresists may be treated in accordance with the present invention. Photoresists are commercially available from a number of sources, including Shipley Company, Kodak, Hunt, DuPont, Arch Chemical, Aquamer, Clariant, JSR Microelectronics, Hoechst Celanese Corporation, and Brewer.

General examples of photoresists include those containing a partially t-butoxycarbonyloxy substituted poly-p-hydroxystyrene, melamine-formaldehyde polymers, polyvinylpyrrolidone, polymethylisoprenylketone, a novolak, a polyvinylphenol, polymers of hydroxystyrene and acrylate, methacrylate polymers or a mixture of acrylate polymers and methacrylate polymers. Further specific examples include poly(p-tert-butoxycarbonyloxy-α-methylstyrene), poly(p-tert-butoxycarbonyloxystyrene), poly(tert-butyl p-vinylbenzoate), poly(tert-butyl p-isopropenylphenyloxyacetate), and poly(tert-butyl methacrylate).

Additional examples include 157 nm sensitive photoresists, 193 nm sensitive photoresists, I-line photoresists, H-line photoresists, G-line photoresists, E-line photoresists, deep UV photoresists, extreme UV photoresists, X-ray resists, electron beam resists and chemically amplified photoresists.

In one embodiment, the alcohol vapor comprises at least one compound having the formula ROH, wherein R is a hydrocarbon group comprising at least 4 carbon atoms, such as from 4 to about 8 carbon atoms. In another embodiment, R is a hydrocarbon group comprising at least about 5 carbon atoms, such as from about 5 to about 7 carbon atoms. Hydrocarbon groups include organic chemical groups comprising carbon and hydrogen atoms, although occasionally a heteroatom may be present, so long as the hydrocarbon character is maintained.

In one embodiment, the alcohol vapor comprises at least one organic compound having a boiling point above about 102° C., such as from about 102° C. to about 175° C. In another embodiment, the alcohol vapor comprises at least one organic compound having a boiling point above about 105° C., such as from about 105° C. to about 170° C. In yet another embodiment, the alcohol vapor comprises at least one organic compound having a boiling point above about 115° C., such as from about 115° C. to about 165° C.

In one embodiment, the alcohol vapor comprises at least one organic compound having a flash point above about 15° C., such as from about 15° C. to about 80° C. In another embodiment, the alcohol vapor comprises at least one organic compound having a flash point above about 20° C., such as from about 20° C. to about 75° C. In yet another embodiment, the alcohol vapor comprises at least one organic compound having a flash point above about 30° C., such as from about 30° C. to about 70° C.

Examples of organic compounds that may be present in the alcohol vapor include those listed in Table 1, along with the approximate boiling point and flash point.

TABLE 1

| Compound | Boiling Point ° C. | Flash Point ° C. |
| --- | --- | --- |
| tert-amyl alcohol | 102 | 21 |
| iso-butyl alcohol | 108 | 27 |
| 3-pentanol | 114 | 40 |
| 2-pentanol | 118 | 33 |
| 2-methyl-2-pentanol | 121 | 21 |
| 3-methyl-3-pentanol | 123 | 46 |
| 2-methyl-3-pentanol | 128 | 46 |
| amyl alcohol | 130 | 43 |
| iso-amyl alcohol | 130 | 45 |
| 3-methyl-2-pentanol | 132 | 40 |
| 4-methyl-2-pentanol | 132 | 41 |
| 3-hexanol | 135 | 41 |
| 2-hexanol | 136 | 46 |
| 1-pentanol | 137 | 48 |
| cyclopentanol | 139 | 51 |
| 2-methyl-2-hexanol | 141 | 40 |
| 2-methyl-3-hexanol | 142 | 40 |
| 2-methyl-1-pentanol | 148 | 50 |
| 5-methyl-2-hexanol | 149 | 46 |
| 3-methyl-1-pentanol | 151 | 58 |
| 1-hexanol | 156 | 60 |
| cyclohexanol | 160 | 67 |
| 1-heptanol | 161 | 64 |
| 4-methyl-1-pentanol | 162 | 51 |

In one embodiment, the organic compounds that may be present in the alcohol vapor are preferably ultradry and/or ultrapurified. Ultradry and ultrapurified organic compounds can be prepared using suitable purification techniques including various types of distillation, pervaporation, nanofiltration, and the like. In one embodiment, ultradry and/or ultrapurified organic compounds contain no particles having a size larger than about 3 microns, less than about 5 parts per billion (ppb) of any trace metal, ion, or compound, and/or less than about 700 parts per million (ppm) water. In another embodiment, ultradry and/or ultrapurified organic compounds contain no particles having a size larger than about 2 microns, less than about 3 ppb of any trace metal, ion, or compound, and/or less than about 400 ppm water.

In one optional embodiment, the alcohol vapor further comprises a minor amount of at least one supplemental organic compound in addition to the major amount of at least one organic compound described above. A minor amount is less than 50% by weight. A major amount is 50% or more by weight.

Supplemental organic compounds generally have boiling points below 100° C. and/or flash points below 13° C.

Examples of supplemental organic compounds include acetone, benzene, cyclohexane, various chlorofluorocarbons such as freon, dichloromethane, and iso-propyl alcohol. In another embodiment, the alcohol vapor does not contain supplemental organic compounds. In some instances, the presence of supplemental organic compounds causes the alcohol vapor to degrade and/or dissolve the patterned photoresist subjected to the cleaning treatment of the present invention. In another optional embodiment, the alcohol vapor further comprises a minor amount of water such as deionized water.

The alcohol vapor comprising at least one organic compound and optionally water and/or optionally at least one supplemental organic compound is employed in vapor drying system. In particular, a patterned photoresist clad semiconductor structure (after development of the photoresist and optional rinsing) is placed in a vapor drying system for cleaning. Basically, the vapor drying system condenses an alcohol vapor comprising at least one organic compound as described above on the surface of the patterned photoresist clad semiconductor structure and then the condensed alcohol vapor is removed from the patterned photoresist clad semiconductor structure taking any water and/or contaminants with it. The condensed alcohol vapor is removed by any suitable means, but typically via dripping (gravity) and evaporation.

Referring to FIG. 1, vapor drying method/system 10 is shown. A patterned photoresist clad semiconductor structure 12A is provided. The patterned photoresist clad semiconductor structure 12A is charged to a vapor drier 14, wherein the structure 12A is contacted with an alcohol vapor containing an alcohol having from 4 to about 8 carbon atoms. The vapor condenses on the structure 12A and then is removed. A cleaned patterned photoresist clad semiconductor structure 12B is obtained from the vapor drier 14. The cleaned patterned photoresist clad semiconductor structure 12B obtained from the vapor drier 14 has less water and fewer contaminants on its surface than the patterned photoresist clad semiconductor structure 12A charged to the vapor drier 14. Moreover, the features of the patterned photoresist are not substantially damaged, dissolved or degraded.

More specifically, the vapor drying system condenses an alcohol vapor comprising at least one organic compound as described above onto the surface of the patterned photoresist clad semiconductor structure, inducing the uptake of any water present on the surface by the organic compound, and causing the separation of any particular matter from the surface. The water-rich organic compound then drips off of the patterned photoresist clad semiconductor structure before water evaporation can occur, and is replaced by additional organic compound condensate, which is then evaporated.

For example, a cassette full of wet patterned photoresist clad semiconductor wafers into a heated dense vapor cloud of a high purity organic compound, such as an alcohol containing from 4 to about 8 carbon atoms. The alcohol vapor condenses on the wafers and combines with any water on the wafers' surfaces. As this liquefying process continues, the water present loses its surfaces tension and shears off the wafers' surfaces and particulate contaminants are displaced. The cassette is then withdrawn above the heated vapor cloud and cooled whereby the wafers dry completely. Vapor condensation formed within the chamber may be removed from the chamber and processed through a purification and recovery system before it is reused.

Alternatively, a vapor drying system may contain distinct vapor and cooling zones. In this connection, the patterned photoresist clad semiconductor wafer is first lowered into the vapor zone where the replacement of any water and particulate matter with the alcohol vapor occurs. The patterned photoresist clad semiconductor wafer is then raised to the cooling zone where the drying process is completed. Alternatively, the vapor drying system may provide that the drying operation take place in a vacuum process chamber.

Vapor drying systems are commercially available from a number of sources including S & K Products International, Inc. of Chestnut Ridge, N.Y. Vapor drying systems are described in U.S. Pat. Nos. 4,841,645; 5,054,210; 5,371,950; 5,539,995; and 6,026,588; which are hereby incorporated by reference in this regard.

The present invention may also be applicable to cleaning surfaces containing organic low k materials, which may be subject to degradation by isoprpyl alcohol. Organic low k materials include polyimides, fluorinated polyimides, polysilsequioxane, benzocyclobutene (BCB), fluorinated benzocyclobutene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), parylene F, parylene N, and amorphous polytetrafluoroethylene.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of cleaning a patterned photoresist clad structure comprising contacting the patterned photoresist clad structure with an alcohol vapor comprising at least one compound having the Formula ROH, wherein R is a hydrocarbon group comprising from 5 to about 8 carbon atoms and the patterned photoresist comprises an organic polymeric material;

condensing the alcohol vapor on the patterned photoresist clad structure; and removing the condensed alcohol vapor from the patterned photoresist clad structure.

2. The method according to claim 1, wherein the patterned photoresist clad structure comprises one of a 157 nm sensitive photoresist, a 193 nm sensitive photoresist, an I-line photoresist, an H-line photoresist, a G-line photoresist, an E-line photoresist, a deep UV photoresist, an extreme UV photoresist, an X-ray resist, and an electron beam resist.

3. The method according to claim 1, wherein the alcohol vapor is an ultradry alcohol vapor and ultrapurified alcohol vapor comprising no particles having a size-larger than about 3 microns, less than about 5 parts per billion of any trace metal, ion, or compound, and less than about 700 parts per million water.

4. The method according to claim 1, wherein the alcohol vapor comprises at least one of tert-amyl alcohol, 3-pentanol, 2-pentanol, 2-methyl-2-pentanol, 3-methyl-3-pentanol, 2-methyl-3-pentanol, amyl alcohol, iso-amyl alcohol, 3-methyl-2-pentanol, 4-methyl-2-pentanol, 3-hexanol, 2-hexanol, 1-pentanol, cyclopentanol, 2-methyl-2-hexanol, 2-methyl-3-hexanol, 2-methyl-1-pentanol, 5-methyl-2-hexanol, 3-methyl-1-pentanol, 1-hexanol, cyclohexanol, 1-heptanol, and 4-methyl-1-pentanol.

5. The method according to claim 1, wherein R is a hydrocarbon group comprising from 5 to about 7 carbon atoms.

6. The method according to claim 1, wherein the compound comprised in the alcohol vapor has a boiling point above about 105° C.

7. The method according to claim 1, wherein the compound comprised in the alcohol vapor has a flash point above about 20° C.

8. The method according to claim 1, wherein the condensed alcohol vapor is removed from the patterned photoresist clad structure by evaporation.

9. The method according to claim 1, wherein the compound comprised in the alcohol vapor has a boiling point above about 115° C.

10. A method of cleaning a patterned photoresist clad structure comprising contacting the patterned photoresist clad structure with an alcohol vapor comprising at least one compound having the Formula ROH, wherein R is a hydrocarbon group comprising from 5 to about 8 carbon atoms, wherein the alcohol vapor is an ultradry alcohol vapor and ultrapurified alcohol vapor comprising no particles having a size larger than about 3 microns, less than about 5 parts per billion of any trace metal, ion, or compound, and less than about 700 parts per million water and the patterned photoresist comprises an organic polymeric material;

condensing the alcohol vapor on the patterned photoresist clad structure; and removing the condensed alcohol vapor from the patterned photoresist clad structure.

11. The method according to claim 10, wherein the patterned photoresist clad structure comprises one of a 157 nm sensitive photoresist, a 193 nm sensitive photoresist, an I-line photoresist, an H-line photoresist, a G-line photoresist, an E-line photoresist, a deep UV photoresist, an extreme UV photoresist, an X-ray resist, and an electron beam resist.

12. The method according to claim 10, wherein the alcohol vapor comprises at least one of tert-amyl alcohol, 3-pentanol, 2-pentanol, 2-methyl-2-pentanol, 3-methyl-3-pentanol, 2-methyl-3-pentanol, amyl alcohol, iso-amyl alcohol, 3-methyl-2-pentanol, 4-methyl-2-pentanol, 3-hexanol, 2-hexanol, 1-pentanol, cyclopentanol, 2-methyl-2-hexanol, 2-methyl-3-hexanol, 2-methyl-1-pentanol, 5-methyl-2-hexanol, 3-methyl-1-pentanol, 1-hexanol, cyclohexanol, 1-heptanol, and 4-methyl-1-pentanol.

13. The method according to claim 10, wherein R is a hydrocarbon group comprising from 5 to about 7 carbon atoms.

14. The method according to claim 10, wherein the compound comprised in the alcohol vapor has a boiling point above about 115° C.

15. The method according to claim 10, wherein the compound comprised in the alcohol vapor has a flash point above about 30° C.

16. A method of cleaning a patterned photoresist clad structure comprising contacting the patterned photoresist clad structure with an alcohol vapor comprising at least one compound having the Formula ROH, wherein R is a hydrocarbon group comprising from 5 to about 8 carbon atoms, wherein the alcohol vapor is an ultradry alcohol vapor and ultrapurified alcohol vapor comprising no particles having a size larger than about 3 microns, less than about 5 parts per billion of any trace metal, ion, or compound, and less than about 700 parts per million water, the patterned photoresist comprises an organic polymeric material, and the patterned photoresist clad structure comprises one of a 157 nm sensitive photoresist, a 193 nm sensitive photoresist, an I-line photoresist, an H-line photoresist, a G-line photoresist, an E-line photoresist, a deep UV photoresist, an extreme UV photoresist, an X-ray resist, and an electron beam resist;

condensing the alcohol vapor on the patterned photoresist clad structure; and removing the condensed alcohol vapor from the patterned photoresist clad structure.

17. The method according to claim 16, wherein the patterned photoresist clad structure comprises one of a 157 nm sensitive photoresist, a 193 nm sensitive photoresist, an I-line photoresist, an E-line photoresist, and a deep UV photoresist.

18. The method according to claim 16, wherein the alcohol vapor comprises at least one of tert-amyl alcohol, 3-pentanol, 2-pentanol, 2-methyl-2-pentanol, 3-methyl-3-pentanol, 2-methyl-3-pentanol, amyl alcohol, iso-amyl alcohol, 3-methyl-2-pentanol, 4-methyl-2-pentanol 3-hexanol, 2-hexanol, 1-pentanol, cyclopentanol, 2-methyl-2-hexanol, 2-methyl-3-hexanol, 2-methyl-1-pentanol, 5-methyl-2-hexanol, 3-methyl-1-pentanol, 1-hexanol, cyclohexanol, 1-heptanol, and 4-methyl-1-pentanol.

19. The method according to claim 16, wherein the compound comprised in the alcohol vapor has a flash point above about 30° C.

* * * * *